United States Patent
Violette et al.

[11] Patent Number: 6,110,788
[45] Date of Patent: Aug. 29, 2000

[54] SURFACE CHANNEL MOS TRANSISTORS, METHODS FOR MAKING THE SAME, AND SEMICONDUCTOR DEVICES CONTAINING THE SAME

[75] Inventors: Michael P. Violette; Jigish Trivedi, both of Boise, Id.

[73] Assignee: Micron Technology, Inc., Boise, Id.

[21] Appl. No.: 09/153,931

[22] Filed: Sep. 16, 1998

[51] Int. Cl.[7] .................................................. H01L 21/336
[52] U.S. Cl. .......................................... 438/301; 438/592
[58] Field of Search .............................................. 438/592

[56] References Cited

U.S. PATENT DOCUMENTS

| | | |
|---|---|---|
| 5,567,647 | 10/1996 | Takahashi . |
| 5,585,302 | 12/1996 | Li . |
| 5,605,854 | 2/1997 | Yoo . |
| 5,627,393 | 5/1997 | Hsu . |
| 5,633,522 | 5/1997 | Dorleans et al. . |
| 5,658,811 | 8/1997 | Kimura et al. . |
| 5,668,394 | 9/1997 | Lur et al. . |
| 5,716,863 | 2/1998 | Arai . |

OTHER PUBLICATIONS

Wolf et al., *Silicon Processing for the VLSI Era*, vol. III, pp. 291–303.

*Primary Examiner*—John F. Niebling
*Assistant Examiner*—Jonathan Hack
*Attorney, Agent, or Firm*—Trask Britt

[57] ABSTRACT

Methods for making surface channel MOS transistors. The methods are practiced by providing a substrate with at least one isolation region, forming a first dielectric layer over the substrate, forming a first polysilicon layer over the first dielectric layer, removing a portion of the first polysilicon layer to expose a portion of the first dielectric layer, forming at least one diffusion region in the substrate underlying the exposed portion of the first dielectric layer, removing the exposed portion of the first dielectric layer, forming a second dielectric layer over the first polysilicon layer and the at least one diffusion region, forming a second polysilicon layer over the second dielectric layer, removing the portion of the second dielectric layer and second polysilicon layer overlying the first polysilicon layer, depositing a conductive layer over the first and second polysilicon layers, depositing a third dielectric layer over the conductive layers and removing a portion of the third dielectric layer, conductive layer, first and second polysilicon layers, and first and second dielectric layers. The conductive layer may be tungsten silicide. These methods provide surface channel MOS transistors using fewer masking steps; flat polysilicon typography which allows fabrication of smaller device features; and tungsten silicide strapped gates scalable to less than 0.25 micrometers with a low resist level.

28 Claims, 6 Drawing Sheets

SURFACE CHANNEL MOS TRANSISTORS, METHODS FOR MAKING THE SAME, AND SEMICONDUCTOR DEVICES CONTAINING THE SAME

BACKGROUND OF THE INVENTION

The present invention generally relates to methods for fabricating integrated circuit and semiconductor devices and the resulting structures. More particularly, the present invention relates to metal-oxide-silicon (MOS) transistor devices for use in memory arrays, methods for making the same, and semiconductor devices containing the same.

One common device in integrated circuits (ICs) is a MOS transistor, such as those described in U.S. Pat. Nos. 5,658,811, 5,585,302, 5,668,394, 5,633,522, 5,567,647, 5,605,854, and 5,627,393, the disclosures of which are incorporated herein by reference. One type of MOS transistor, a MOS field-effect-transistor (MOSFET), can be characterized in one manner as either "buried channel" or "surface channel" depending on the location of the channel. In surface channel (SC) devices, the channel is located near the surface of the substrate where the gate oxide of the transistor is disposed, generally at a depth of about 100 Å. In buried channel (BC) devices, the channel is located deeper in the substrate and further away from the gate oxide, generally at a depth of about 1000 Å.

The performance of buried-channel and surface-channel MOSFET devices also differs. For example, the mobility of carriers (holes or electrons) in buried channels is about 15% higher than carriers in surface channels. Unfortunately, the advantages of BC MOSFETs are often outweighed by some of their disadvantages. As the size of MOSFET devices shrinks and gate lengths become smaller, the breakdown voltage (BVdSS) from the drain to the source, as well as control of the threshold voltage ($V_t$) in BC MOSFET devices become worse, as described in pages 294–303 of *Silicon Processing For The VLSI Era* by Wolf et al., the disclosure of which is incorporated herein by reference.

To better control BVdSS and $V_t$ as device dimensions shrink, SC MOSFET devices have begun replacing BC MOSFET devices. SC MOSFET devices are easy to fabricate with salicide processes since the implanting step used to form the source and drain regions also implants the polysilicon gate. SC MOSFET devices, however, typically operate with a dual-gate operation that can require either a thick oxide layer during fabrication so p-dopants (such as boron) do not diffuse quickly into the surrounding areas and destroy the device performance or a hardened thin oxide layer where nitrogen is incorporated into the oxide layer. As device dimensions of SC MOSFET devices shrink into the submicron dimensions, these oxide layers unfortunately become too thin to prevent this out-diffusion of boron. Moreover, the fabrication processes for SC MOSFET devices often require additional masking steps during implantation of the channels, making manufacture more complex and costly.

SUMMARY OF THE INVENTION

The present invention provides methods for forming IC devices and the structures formed from these methods. Specifically, the present invention provides methods for forming IC devices containing SC MOS transistors. In particular, the present invention provides methods for fabricating SC MOSFET devices—including both SC P-MOSFET and SC N-MOSFET devices—without the additional masking steps that would conventionally be required during manufacture of SC MOSFET devices.

The methods of the present invention are practiced by the steps of providing a substrate with at least one isolation region and then forming a first dielectric layer over the substrate, and then forming a first polysilicon layer over the first dielectric layer. A portion of the first polysilicon layer is then removed to expose a portion of the first dielectric layer and at least one diffusion region is formed in the substrate underlying the exposed portion of the the first dielectric layer. The exposed portion of first dielectric layer is then removed, a second dielectric layer is then formed over the first polysilicon layer and the at least one diffusion region, and a second polysilicon layer is formed over the second dielectric layer. Next, the portions of the second dielectric layer and second polysilicon layer overlying the first polysilicon layer are removed, a conductive layer is deposited over the first and second polysilicon layers, and a third dielectric layer is formed over the conductive layer. Finally, an undesired portion of the third dielectric layer, conductive layer, first and second polysilicon layers, and first and second dielectric layers is removed. The first and second dielectric layers may comprise the same or different materials and/or may be the same or different thickness. The first and second polysilicon layers may be doped independently with different dopant species. The conductive layer may be tungsten silicide.

The present invention fabricates SC MOSFET devices without some of the masking steps that are conventionally required, thus lowering the cost for fabricating SC MOSFET devices. The present invention also provides flat polysilicon typography during fabrication of SC MOSFETS, allowing easier masking and etching of the polysilicon and easier fabrication of smaller device features. The present invention also fabricates a tungsten silicide strapped gate that is scalable to less than 0.25 micrometers with a low resist level.

BRIEF DESCRIPTION OF THE DRAWINGS

The Figures presented in conjunction with this description are not actual views of any particular portion of an actual semiconducting device or component, but are merely representations employed to more clearly and fully depict the present invention.

DETAILED DESCRIPTION OF THE INVENTION

The following description provides specific details, such as material thicknesses and types, in order to provide a thorough understanding of the present invention. The skilled artisan, however, would understand that the present invention may be practiced without employing these specific details. Indeed, the present invention can be practiced in conjunction with fabrication techniques conventionally used in the industry.

The process steps and structures described below do not form a complete process flow for manufacturing IC devices or a completed device. Only the process steps and structures necessary to understand the present invention are described below.

FIGS. 1–12 illustrate one exemplary SC MOSFET device according to the present invention and the steps in making this device. It will be understood, however, by those skilled in the art that other SC MOSFET devices could be formed by slight modifications of the illustrated method, such as substituting other polarities to those illustrated.

Figure 1:
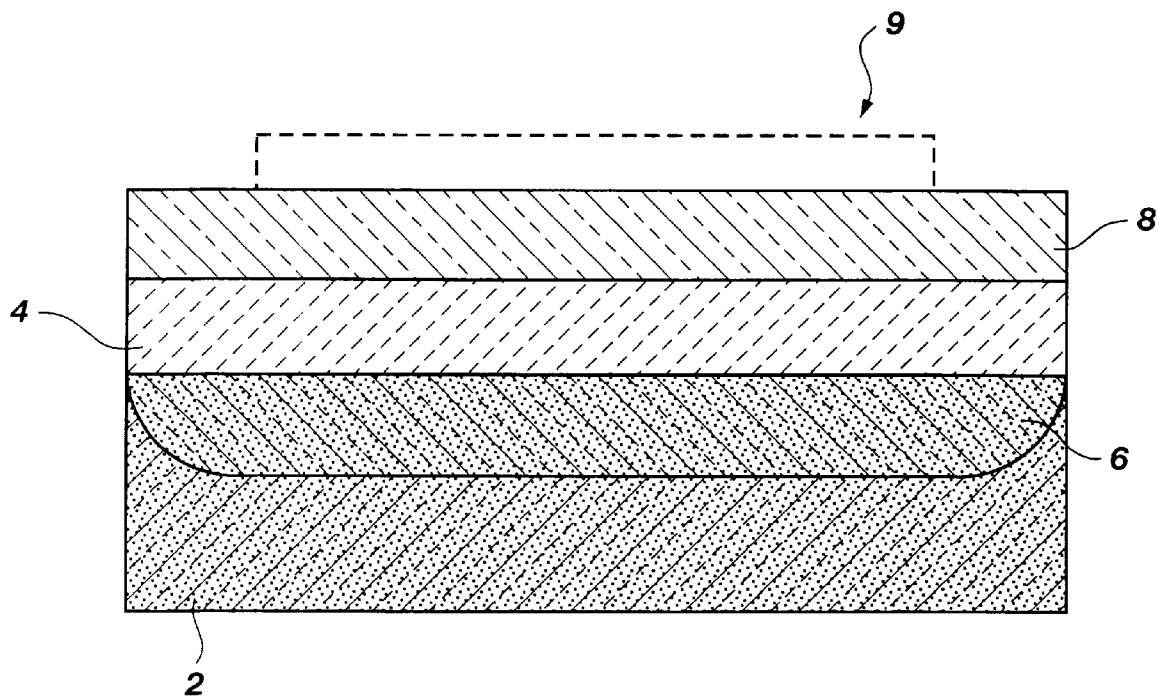
FIGS. 1–12 are cross-sectional views of the steps of one exemplary process for making SC MOSFET devices according to the present invention and the resulting structures.

As shown in FIG. 1, substrate 2 is first provided. Substrate 2 may be any surface suitable for device formation, such as a semiconductor wafer, and may be doped and/or include an epitaxial layer. Preferably, substrate 2 is a silicon wafer or bulk silicon region, such as a silicon-on-insulator or silicon-on-sapphire structure. More preferably, substrate 2 is a silicon wafer lightly doped with p-type dopants, such as boron, to a concentration of $1\times10^{15}$ atoms/cm$^3$.

Next, active device regions and isolation regions are defined in the upper surface of substrate 2 by any suitable process known in the art. One preferred process for defining these regions begins by forming pad oxide layer 4 as a stress relief layer over the surface of substrate 2. Pad oxide layer 4 is then thermally grown or deposited by chemical vapor deposition (CVD) to a thickness of about 50 to about 150 angstroms on substrate 2. At least one p-well region 6 is then formed to a depth of about 10,000 to about 20,000 angstroms in substrate 2 by a blanket implant of p-type dopant, such as boron, through pad oxide layer 4 to a concentration of $2\times10^{16}$ atoms/cm$^3$. Silicon nitride layer 8 is then deposited over pad oxide layer 4. Any suitable process known in the art, such as a CVD process, can be employed to deposit silicon nitride layer 8 to a thickness ranging from about 500 to about 2000 Å.

Figure 2:
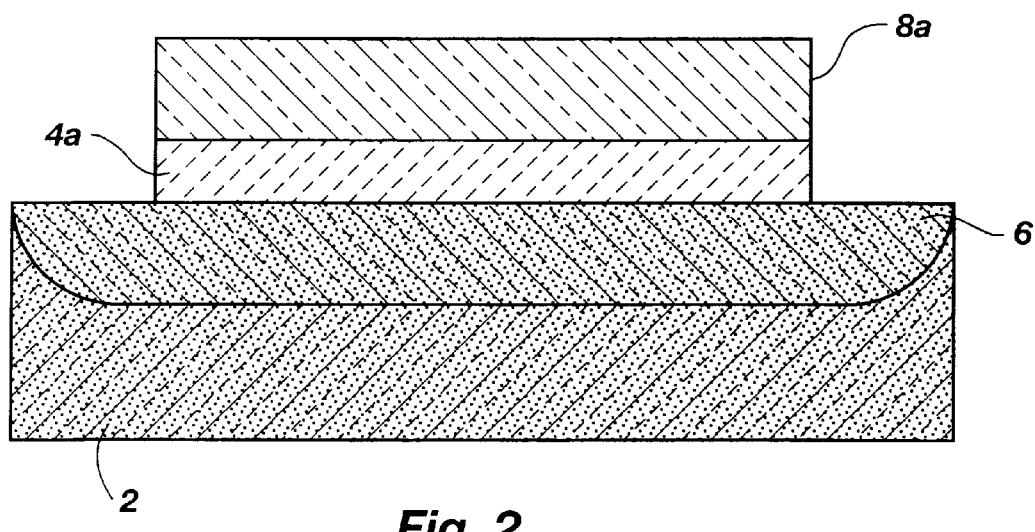

Next, as shown in FIG. 2, a pattern and etch process is employed to remove portions of silicon nitride layer 8 and pad oxide layer 4 above portions of substrate 2 where isolation regions will be formed. Silicon nitride layer 8a and pad oxide layer 4a will remain over regions of substrate 2 where active devices will be formed. Any suitable pattern and etch process known in the art, such as a photolithographic pattern and etch process, can be used to remove the portions of silicon nitride layer 8 and pad oxide layer 4. For example, a photoresist film can be spun on silicon nitride layer 8, developed, and portions thereof removed to leave photoresist mask 9 (shown by the broken line in FIG. 1) above silicon nitride layer 8. Using photoresist mask 9, the undesired portions of silicon nitride layer 8 and pad oxide layer 4 are then removed by any suitable anisotropic etching process to obtain silicon nitride layer 8a and pad oxide layer 4a. Photoresist mask 9 may then be removed by any suitable process known in the art which does not attack or degrade silicon nitride layer 8a or substrate 2.

Figure 3:
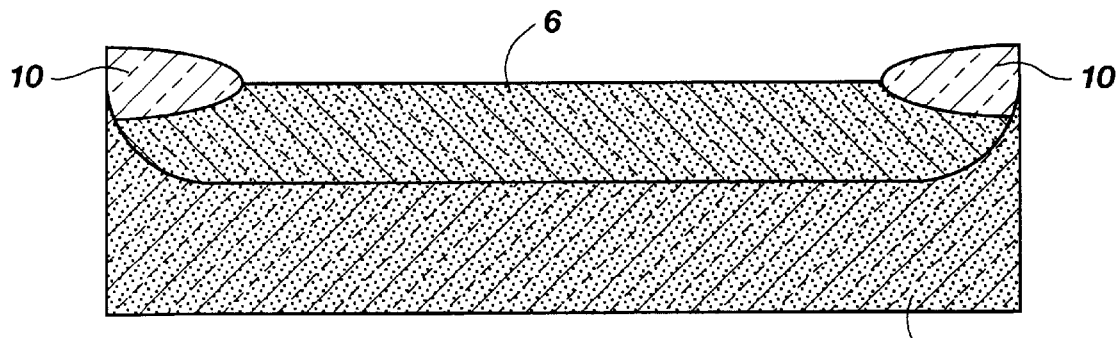

As shown in FIG. 3, isolation regions 10 are then formed in substrate 2. Isolation regions 10 may be formed by any suitable process which employs silicon nitride layer 8a as a mask, such as a trench-and-refill or local oxidation of silicon (LOCOS) process. Preferably, as illustrated in FIG. 3, isolation regions 10 are field oxide regions formed by a shallow trench isolation process. The thickness of isolation regions 10 may range from about 2000 to about 4000 angstroms. After forming isolation regions 10, silicon nitride layer 8a and pad oxide layer 4a are removed by any suitable process known in the art. Preferably, silicon nitride layer 8a and pad oxide layer 4a are removed by a wet etch process using phosphoric acid and/or hydrofluoric acid to leave substrate 2 with isolation regions 10.

Figure 4:
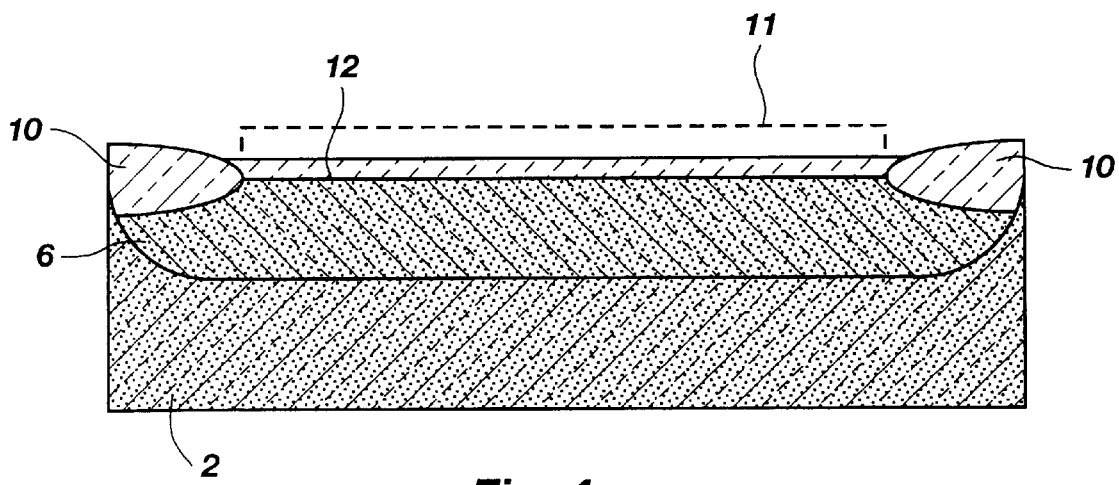

Then, as illustrated in FIG. 4, sacrificial oxide layer 12 is formed over substrate 2. Sacrificial oxide layer 12 may be formed by any suitable thermal oxidation process which grows the sacrificial oxide layer to a thickness of about 100 to about 400 angstroms. Next, a field implant step is performed to implant dopants into isolation regions 10. In this field implant step, portions of the structure of FIG. 4 not containing isolation regions 10 are masked by implant mask 11 (shown by the broken line in FIG. 4) using any suitable masking process in the art. The desired dopants are then implanted selectively into the isolation regions 10 using implant mask 11. Preferably, boron ions are implanted at an energy ranging from about 50 to about 150 keV.

After the field implant step, implant mask 11 is removed by any suitable process in the art and a blanket enhancement implant performed. The blanket enhancement implant is performed across the entire surface of the structure of FIG. 4. Any suitable implantation process known in the art can be employed, such as implanting boron ions at an energy ranging from about 15 to about 100 keV. The enhancement implant step, also known as an adjust implant, is performed to enhance the implantation steps previously performed in the fabrication process and regulate the dopant concentration and control the threshold voltage of the MOSFET. During the enhancement implant step, sacrificial oxide layer 12 reduces the channeling effects of the dopants in substrate 2. Once the enhancement implant has been performed, sacrificial oxide layer 12 is removed by any suitable removal process, such as an etching process, which does not degrade isolation regions 10 or substrate 2.

Figure 5:
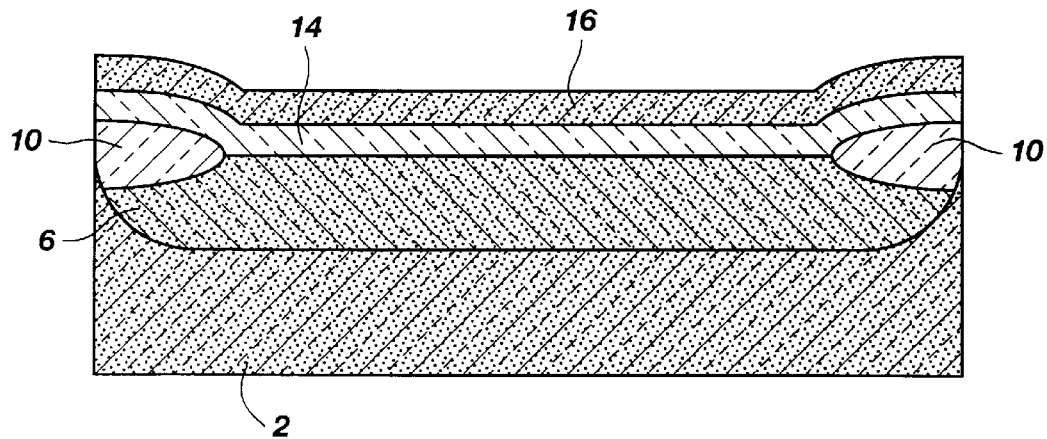

Next, as depicted in FIG. 5, dielectric layer 14 is formed over substrate 2 and, optionally, isolation regions 10. Any dielectric material suitable as a gate dielectric, such as silicon oxide or silicon nitride, can be used as dielectric layer 14. Preferably, dielectric layer 14 is a silicon oxide layer formed by thermally oxidizing the preferred silicon substrate 2 to form a high-quality silicon oxide layer with little to no contamination. The preferred silicon oxide layer is formed primarily over the exposed regions of substrate 2, but may also be formed over isolation regions 10, especially if the silicon oxide layer is deposited, rather than thermally grown. The thickness of dielectric layer 14 may range from about 30 to about 150 angstroms.

Next, polysilicon layer 16 is formed over dielectric layer 14. Polysilicon layer 16 may be formed by any suitable deposition method known in the art, such as physical or chemical vapor deposition (CVD). Preferably, polysilicon layer 16 is deposited by CVD to a thickness ranging from about 500 to about 2000 angstroms. Polysilicon layer 16 is then doped with an n-type dopant, such as arsenic, by any suitable ion implantation process known in the art. Alternatively, polysilicon layer 16 can be in-situ doped during deposition by including a gas containing the desired n-type dopant in the deposition atmosphere.

Figure 6:
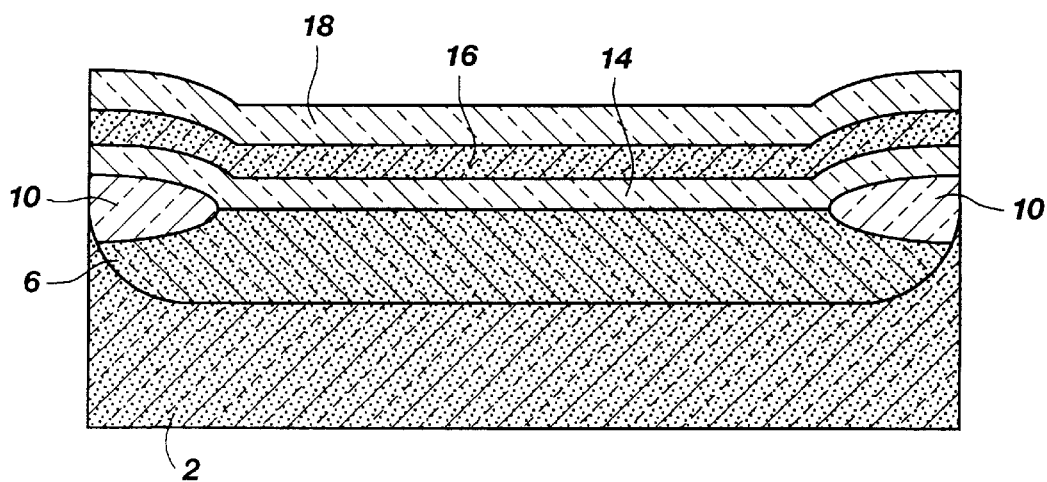

Optionally, as illustrated in FIG. 6, silicon nitride layer 18 can then be deposited over polysilicon layer 16. Silicon nitride layer 18 can be deposited by any suitable method known in the art, such as a CVD process, to a thickness ranging from about 100 to about 300 angstroms. As explained below, silicon nitride layer 18 serves as an etch stop during a later planarization process and prohibits subsequent oxidation steps from oxidizing the polysilicon.

Figure 7:
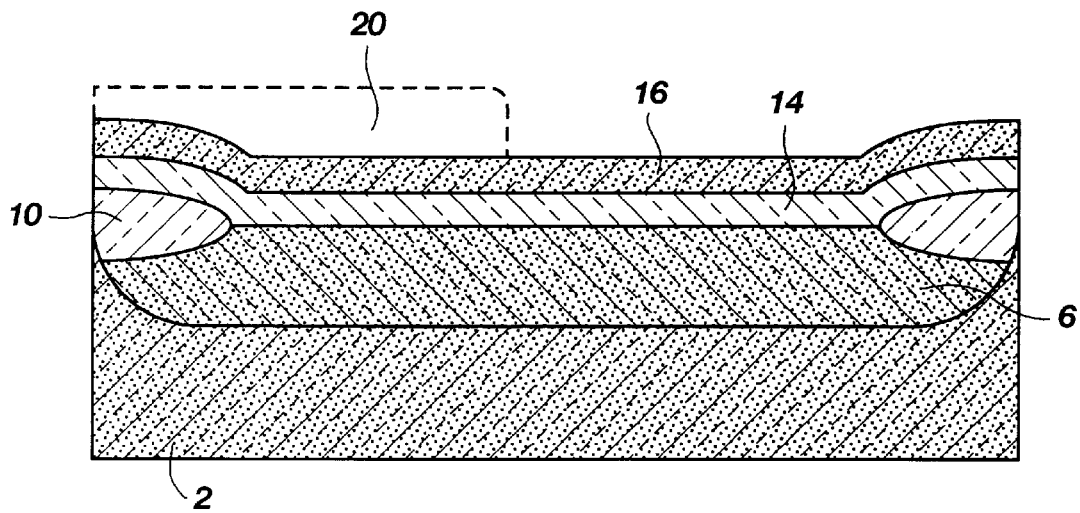

Next, as shown in FIG. 7, photoresist mask 20 (represented by the broken line) is formed over polysilicon layer 16. Any suitable process known in the art can be employed to form photoresist mask 20 to a thickness ranging from about 5000 to about 10,000 angstroms. Preferably, photoresist mask 20 is formed by depositing a photoresist layer, developing the photoresist layer, and removing portions of the developed layer by any suitable process. Using photoresist mask 20, the exposed portions of polysilicon layer 16 are removed, preferably by using an etching process such as a dry etch process, using chlorine-based chemistry.

Figure 8:
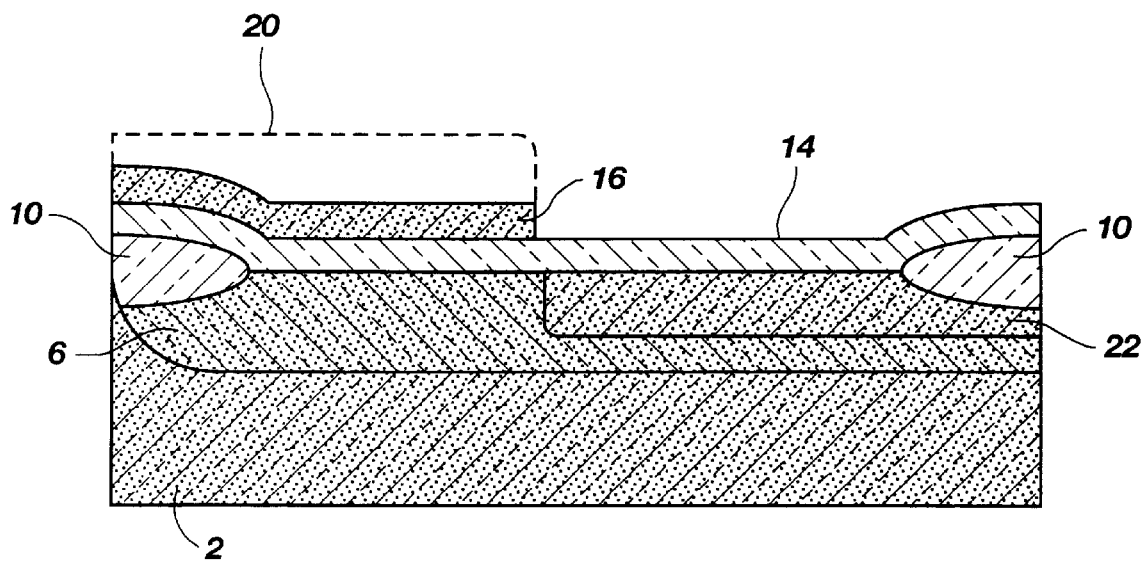

As shown in FIG. 8, removing a portion of polysilicon layer 16 exposes a portion of dielectric layer 14. N-well 22 is then formed in the surface of substrate 2 underlying the exposed portion of dielectric layer 14. N-well 22 may be formed by any suitable process known in the art which yields the desired impurity profile for n-well 22. Preferably, n-well 22 is formed by high-energy ion implantation of the desired n-type dopant, such as arsenic or phosphorous, through dielectric layer 14 at an energy level of 150 keV to 1000 MeV. Alternatively, to obtain the desired n-well profile, multiple implants of arsenic or phosphorous can be performed at multiple energies ranging from about 100 KeV to about 3.0 MeV. To compensate for the enhancement implantation performed after the field implantation, a low energy n-type ion implantation process is then performed using arsenic at an energy of 5 to 100 keV in order to obtain the desired threshold voltage for the device that will be formed in this region.

Following the high-energy and low-energy implantation steps, photoresist mask 20 is then removed. Photoresist mask 20 can be removed by any suitable etching process known in the art which does not degrade polysilicon layer 16. The portion of dielectric layer 14 remaining on substrate 2 after the high-energy and low-energy implantation steps is then removed. Any suitable removal process which does not degrade polysilicon layer 16, substrate 2, or isolation regions 10 can be employed to remove this remaining portion of dielectric layer 14.

Figure 9:
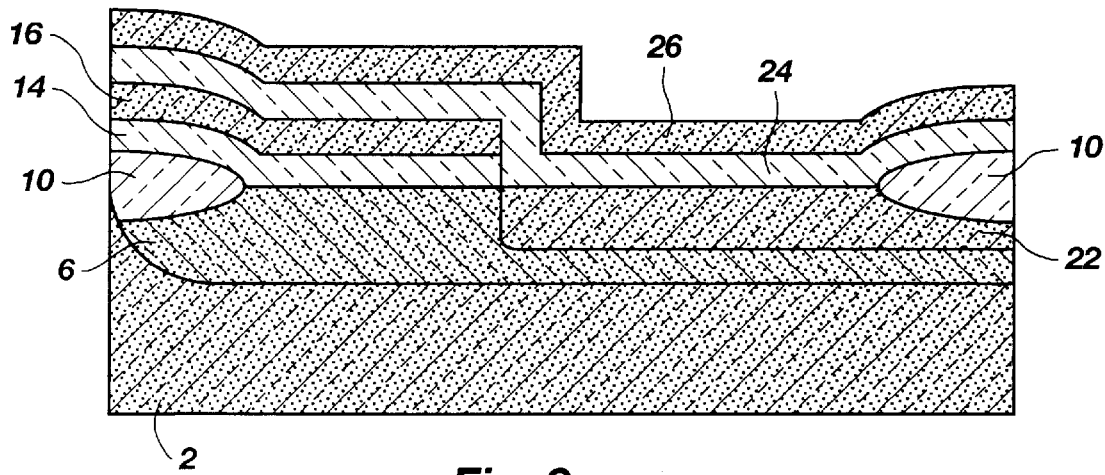

Next, as shown in FIG. 9, dielectric layer 24 is formed over polysilicon layer 16 and substrate 2. Any dielectric material suitable as a gate dielectric, such as silicon oxide, silicon nitride, or silicon oxynitride, can be used as dielectric layer 24. Dielectric layer 24 may be the same or a different material than dielectric layer 14. Preferably, dielectric layer 24 is a silicon oxide layer formed by a conformal deposition process to form a high-quality silicon oxide layer with little to no contamination with impurities. The preferred silicon oxide layer 24 is formed over the exposed regions of substrate 2 and over polysilicon layer 16 if silicon nitride layer 18 has not been formed over polysilicon layer 16. The thickness of dielectric layer 24 can be the same or different than the thickness of dielectric layer 14, and may range from about 30 to about 100 angstroms.

Polysilicon layer 26 is then formed over dielectric layer 24. Polysilicon layer 26 may be formed by any suitable deposition method in the art, such as physical or chemical vapor deposition. Preferably, the polysilicon is deposited by CVD to a thickness ranging from about 500 to about 2000 angstroms. Polysilicon layer 26 is then doped with a p-type dopant, such as boron, by a suitable ion implantation process known in the art, such as the processes used to dope polysilicon layer 16. Alternatively, polysilicon layer 26 can be in-situ doped during deposition of polysilicon layer 26 by including a gas containing the desired p-type dopant in the deposition ambient.

Figure 10:
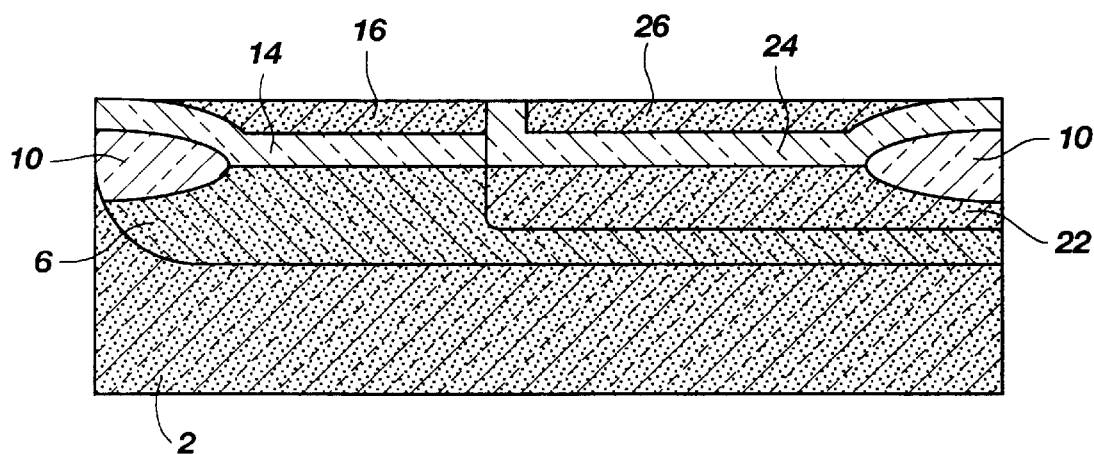

Next, as depicted in FIG. 10, polysilicon layer 26 and dielectric layer 24 above polysilicon layer 16 and dielectric layer 14 are removed. Any suitable process which removes polysilicon layer 26 and dielectric layer 24 without removing the polysilicon layer 16 and dielectric layer 14 can be employed in the present invention. Preferably, this removal process is performed by planarization, such as an abrasive planarization process. More preferably, the planarization is chemical mechanical planarization using a peroxide based slurry or fixed abrasives. The planarization proceeds until the surface of polysilicon layer 16 is exposed. If silicon nitride layer 18 has been deposited (see FIG. 6), the planarization proceeds until the surface of silicon nitride layer 18 is exposed, after which the silicon nitride layer is removed by a suitable etching process which does not attack polysilicon layers 16 or 26 or dielectric layer 24.

Figure 11:
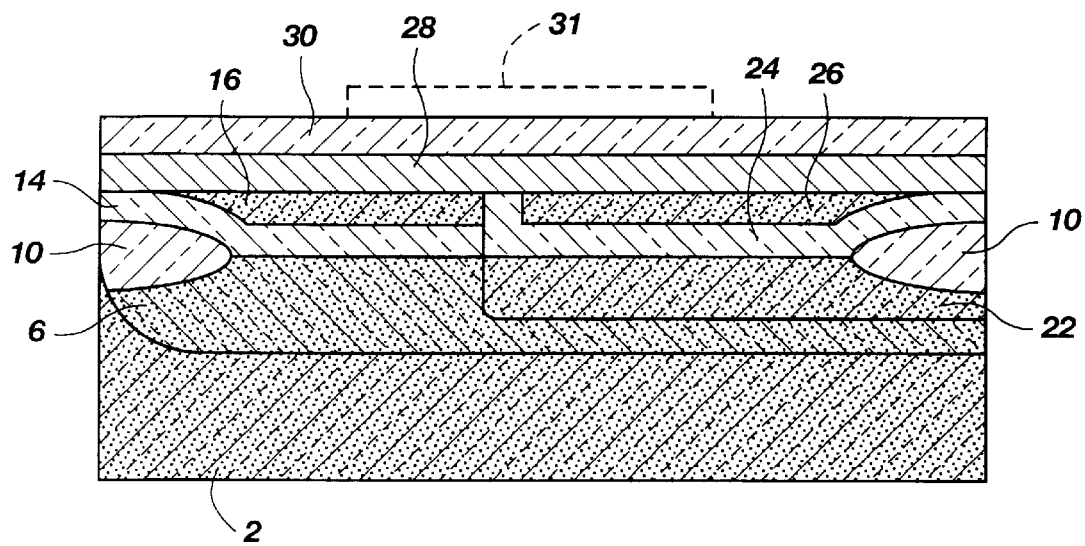

As shown in FIG. 11, conductive layer 28 is then deposited over polysilicon layers 16 and 26. Conductive layer 28 acts as a metal contact, or conductive bridge, connecting polysilicon layers 16 and 26. Accordingly, conductive layer 28 can comprise any conductive material known in the art, such as metals and metal alloys. Preferably, conductive layer 28 is tungsten silicide since tungsten silicide, unlike other conductive materials like titanium silicide, is scalable to less than 0.25 micrometers with a low resist level. The preferred tungsten silicide layer may be deposited by CVD to a thickness ranging from about 200 to about 1500 angstroms.

Next, dielectric layer 30 is deposited over conductive layer 28. Dielectric layer 30 may comprise any suitable dielectric material known in the art, such as silicon nitride or silicon oxide. Dielectric layer 30 is deposited by a suitable CVD process known in the art to a thickness ranging from about 1000 to about 4000 angstroms.

Figure 12:
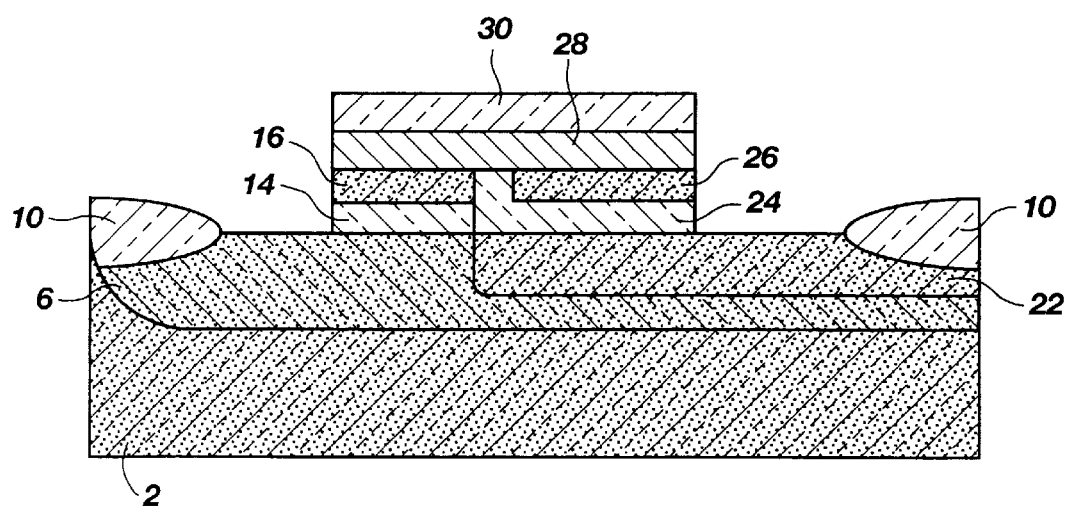

A photoresist layer is then deposited and patterned similar to the patterning described above to form photoresist mask 31 (shown by the broken line in FIG. 11). Portions of conductive layer 28, polysilicon layers 16 and 26, and dielectric layers 14, 24, and 30 not needed for the desired MOSFET device are then removed by a suitable etching process. For example, as shown in FIG. 12, this etching process could remove such layers where subsequent metal contacts are to connect with n-well 22 and p-well 6. Photoresist mask 31 could then be removed and subsequent processing performed per to complete the integrated circuit device.

By using the above process, additional mask steps need not be employed. Conventionally, using the structure in FIG. 12 as an example, surface channels (implanted areas immediately below dielectric layers 14 and 24) in MOSFET devices would have been separately formed by: first, fabricating the first transistor (dielectric layer 14 and polysilicon layer 16) and second transistor (dielectric layer 24 and polysilicon layer 26); second, masking the first transistor while implanting the second transistor to form the surface channel under the second transistor; and third, masking the second transistor while implanting the first transistor to form the surface channel under the first transistor. The above process allows these additional masking steps to be eliminated, thereby decreasing the cost and complexity for SC MOSFET device fabrication. In addition, the inventive process uses-as an example-the mask that defines the SC P-MOSFET as the n-well mask, rather than two separate masks. Further, both polysilicon layers can be in situ doped and, therefore, the inventive process eliminates the need of implanting two polysilicon layers, cleaning steps, and activation steps.

Further enhancements can be performed in the process. Dielectric layers 14 and 24 can be doped. Moreover, dielectric layers 14 and 24 can be made of the same or different materials. Further, dielectric layer 24 can inhibit boron punch-through often exhibited during boron doping by either being a hardened oxide layer or by using silicon oxynitride as the material for dielectric layer 24.

Having thus described in detail the preferred embodiments of the present invention, it is to be understood that the invention defined by the appended claims is not to be limited by particular details set forth in the above description, as many apparent variations thereof are possible without departing from the spirit or scope thereof.

We claim:

1. A method for fabricating an integrated circuit, comprising:

providing a substrate with at least one isolation region;

forming a first dielectric layer over the substrate;

forming a first polysilicon layer over the first dielectric layer;

removing a portion of the first polysilicon layer to expose a portion of the first dielectric layer;

forming at least one diffusion region in the substrate underlying the exposed portion of the first dielectric layer;

removing the exposed portion of the first dielectric layer;

forming a second dielectric layer over the first polysilicon layer and the at least one diffusion region;

forming a second polysilicon layer over the second dielectric layer;

removing a portion of the second dielectric layer and second polysilicon layer overlying the first polysilicon layer;

depositing a conductive layer over the first and second polysilicon layers;

forming a third dielectric layer over the conductive layer; and removing an undesired portion of the third dielectric layer, conductive layer, first and second polysilicon layers, and first and second dielectric layers.

2. The method of claim 1, including providing the substrate as a silicon wafer.

3. The method of claim 2, including lightly doping the silicon wafer with a p-type dopant to form a p-well.

4. The method of claim 3, including providing the at least one isolation region as at least one field oxide region.

5. The method of claim 4, including forming a sacrificial oxide layer over the substrate and the at least one field oxide region prior to forming the first dielectric layer.

6. The method of claim 5, further comprising:

forming a mask over a portion of the sacrificial oxide layer overlying the substrate;

implanting a dopant into the at least one field oxide region through the sacrificial oxide layer; and removing the mask after implanting the dopant into the at least one field oxide region.

7. The method of claim 6, including implanting a dopant into the substrate and the at least one field oxide region through the sacrificial oxide layer and then removing the sacrificial oxide layer.

8. The method of claim 4, including forming the first dielectric layer to comprise silicon oxide.

9. The method of claim 8, including forming the silicon oxide layer by thermally oxidizing the substrate.

10. The method of claim 8, including depositing the first polysilicon layer over the first dielectric layer.

11. The method of claim 10, including doping the first polysilicon layer.

12. The method of claim 1, including removing the first polysilicon layer by a photolithographic patterning and etching process.

13. The method of claim 1, including forming the at least one diffusion region by implanting a first n-type dopant at a first energy followed by implanting a second n-type dopant at a second energy lower than the first energy to form an n-well.

14. The method of claim 13, the first n-type dopant being arsenic or phosphorous and the first energy ranging from about 150 KeV to about 1000 MeV and the second n-type dopant being arsenic and the second energy ranging from about 5 to about 100 KeV.

15. The method of claim 1, including forming the at least one diffusion region by implanting an n-type dopant by multiple energies ranging from about 100 KeV to about 3.0 MeV.

16. The method of claim 14, including depositing a silicon nitride layer over the first polysilicon layer.

17. The method of claim 13, including forming the second dielectric layer by chemical vapor deposition.

18. The method of claim 17, including forming the second dielectric layer to comprise silicon oxide.

19. The method of claim 18, including forming the second polysilicon layer by deposition.

20. The method of claim 19, including doping the second polysilicon layer.

21. The method of claim 20, including removing the portion of the second dielectric layer and second polysilicon layer overlying the first polysilicon layer by abrasive polishing.

22. The method of claim 21, wherein said abrasive polishing comprises chemical mechanical planarization.

23. The method of claim 21, including forming the conductive layer to comprise tungsten silicide.

24. The method of claim 23, including depositing the conductive layer by chemical vapor deposition.

25. The method of claim 23, including forming the third dielectric layer to comprise silicon oxide or silicon nitride.

26. The method of claim 25, including forming the third dielectric layer by deposition.

27. The method of claim 25, including removing the undesired portion of the third dielectric layer, conductive layer, first and second polysilicon layers, and first and second dielectric layers by a photolithographic pattern and etch process.

28. The method of claim 27, wherein removing the undesired portion of the third dielectric layer, conductive layer, first and second polysilicon layers, and first and second dielectric layers exposes the n-well and p-well.

* * * * *